United States Patent
Lin

(12) 
(10) Patent No.: US 6,627,358 B1
(45) Date of Patent: Sep. 30, 2003

(54) MASK REPAIR IN RESIST IMAGE

(75) Inventor: Burn J. Lin, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 99 days.

(21) Appl. No.: 09/838,514

(22) Filed: Apr. 20, 2001

(51) Int. Cl.$^7$ ............... G03P 9/00; G03C 5/00
(52) U.S. Cl. ............... 430/5; 430/394
(58) Field of Search ............ 430/5, 397, 324, 430/394; 378/35

(56) References Cited

U.S. PATENT DOCUMENTS

| | | | |
|---|---|---|---|
| 4,548,883 A | 10/1985 | Wagner | 430/5 |
| 4,727,234 A | 2/1988 | Oprysko et al. | 219/121 L |
| 5,443,931 A * | 8/1995 | Watanabe | 430/5 |
| 5,506,080 A * | 4/1996 | Adair et al. | 430/5 |
| 5,607,776 A | 3/1997 | Mueller et al. | 428/472 |
| 5,795,685 A | 8/1998 | Liebmann et al. | 430/5 |
| 5,935,737 A | 8/1999 | Yan | 430/5 |
| 5,981,110 A * | 11/1999 | George et al. | 430/5 |
| 6,132,940 A * | 10/2000 | Mih et al. | 430/394 |
| 6,420,101 B1 * | 7/2002 | Lu et al. | 430/326 |

* cited by examiner

Primary Examiner—S. Rosasco
(74) Attorney, Agent, or Firm—George O. Saile; Stephen B. Ackerman; Larry J. Prescott

(57) ABSTRACT

A method of producing defect free resist images from defective phase shifting or extreme ultraviolet masks is described. The method uses supplemental radiation to achieve direct repair of the resist image. Pinhole type of defects in opaque pattern elements, which would cause overexposed regions of resist and can readily be repaired on the mask, are first repaired directly on the mask before the mask is used in the exposure of a layer of resist. The remaining defects on the mask are left as they are and not repaired. The layer of resist is then exposed using the partially repaired mask. The remaining mask defects will cause unexposed latent images in the layer of resist. These unexposed regions of the resist are then exposed using supplemental radiation thereby correcting the exposure of the layer of resist. The layer of resist is then developed to form a defect free resist image.

35 Claims, 5 Drawing Sheets

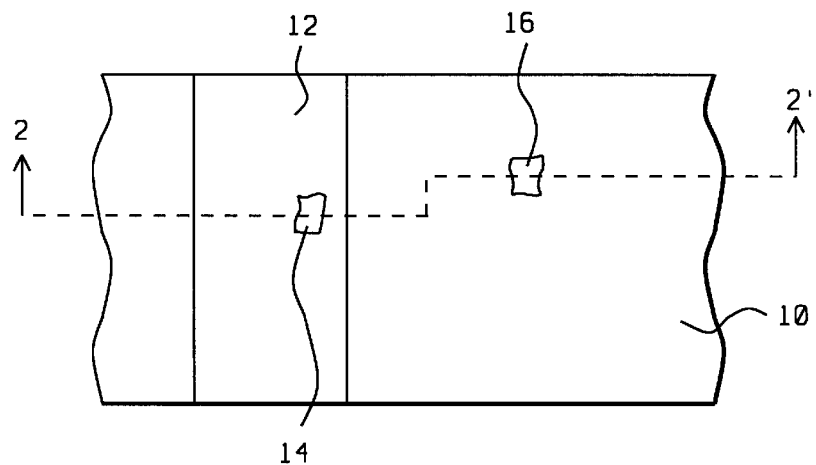
FIG. 1 – Prior Art
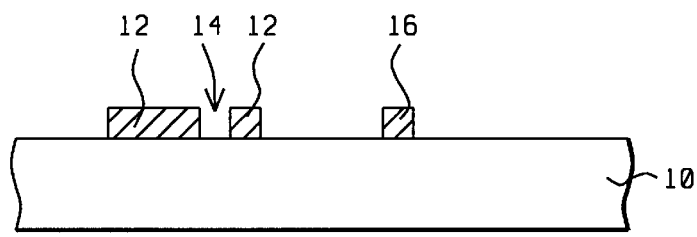
FIG. 2 – Prior Art
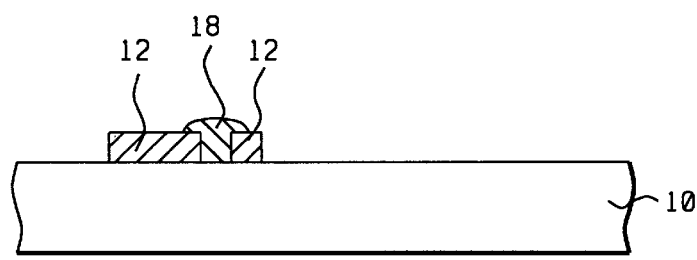
FIG. 3 – Prior Art

MASK REPAIR IN RESIST IMAGE

BACKGROUND OF THE INVENTION (1) Field of the Invention

This invention relates to a method of repairing mask defects and more particularly to a method of repairing mask defects by repairing the latent image in a layer of exposed resist rather than direct mask repair.

(2) Description of the Invention

In the manufacture of semiconductor integrated circuits masks are often used to form lithographic images in a layer of resist. Defect free masks are important in order to obtain high quality resist images. Since masks are often not perfect, mask repair is an important part of mask fabrication.

U.S. Pat. No. 5,935,737 to Yan describes a method of fabricating extreme ultraviolet, EUV, masks which eliminates damage arising from repairing defects.

U.S. Pat. No. 5,607,776 to Mueller et al. describes a method of in-situ cleaning a Ti target in a Ti+TiN anti-reflective coating process.

U.S. Pat. No. 5,981,110 to George. et al. describes a method for repairing a defect in an opaque layer of a photomask. The method comprises applying a photoresist layer over the opaque layer, removing the photoresist over the defect to reveal the defect, and then repairing the defect using a wet etch.

U.S. Pat. No. 5,795,685 to Liebmann et al. describes a method and apparatus for correcting defects in a phase shifting mask.

U.S. Pat. No. 4,727,234 to Oprysko et al. describes a LASER based apparatus for repairing both clear and opaque defects in a photomask having a metal film pattern on a glass plate.

U.S. Pat. No. 4,548,883 to Wagner describes a method of mask repair using ion beam removal of material at the location of a mask defect.

SUMMARY OF THE INVENTION

Masks are used in semiconductor integrated circuit manufacture to expose pattern images in a layer of resist. The exposed resist is then developed to form a resist pattern which serves as a mask to transfer the pattern image to the integrated circuit wafer. It is critically important that the resist pattern thus formed is accurate and free of defects. Any mask defects will be transferred to the resist pattern and mask defects must be carefully controlled.

For binary intensity masks, mask defects can be repaired to prevent transfer of the defects to a layer of resist. FIG. 1 shows a top view and FIG. 2 a cross section view of a binary intensity mask having defects in the mask. The defects can take the form of pinholes 14 in an opaque region 12 of the mask or unwanted opaque material 16 on the transparent mask substrate 10. Conventionally, as shown in FIG. 3, these mask defects can be repaired by removing the unwanted opaque material and filling the pinholes with opaque material 18. These mask repairs can be readily accomplished with conventional binary intensity masks.

In the case of phase shifting masks, PSM, or extreme ultraviolet, EUV, masks, however, these mask repairs are difficult, if not impossible to accomplish. FIGS. 4 and 5 illustrate the problem of mask repair for phase shifting masks. FIG. 4 shows a top view and FIG. 5 a cross section view, taken along line 5–5' of FIG. 4, of a phase shifting mask having an opaque region 22 with a pinhole defect 24 and defects comprising unwanted opaque material 28 on the mask substrate 20 and a defect 26 in the mask substrate causing a phase defect. As in the case of the binary intensity mask the pinhole defect 24 in the opaque material 22 can be repaired but repair of the other defects is much more difficult. It is difficult to fill the defect 26 in the mask substrate with material having the proper thickness and index of refraction to correct the phase defect. Methods used to remove unwanted opaque material 28 may damage the mask substrate 20 and result in additional phase defects.

FIGS. 10 and 11 illustrate the problem of mask repair for extreme ultraviolet, EUV, masks. FIG. 10 shows a top view and FIG. 11 a cross section view, taken along line 11–11' of FIG. 10 of an EUV mask. As shown in FIG. 11 the EUV mask is fabricated by forming reflective layers 46, 48, and 50 on a mask substrate. Pattern elements 42 are formed from opaque absorptive material. One type of defect encountered are pinholes 44 in the pattern elements, see FIGS. 10 and 11. Other defects 56 and 58, see FIG. 10, are caused by foreign material 52 and 54, see FIG. 11, between the layers of reflective material 46, 48, and 50. The pinhole defects 44 in the opaque pattern elements 42 are readily repaired but the defects caused by foreign material between reflective layers is very difficult to repair. The defects caused by foreign material between reflective layers will cause underexposed regions of resist.

It is a principle objective of this invention to provide a method of overcoming mask defects to produce a defect free resist image.

This objective is accomplished by direct repair of the resist image. The pinhole type of defects in opaque pattern elements, which would cause overexposed regions of resist and can readily be repaired on the mask, are first repaired directly on the mask before the mask is used in the exposure of a layer of resist. The remaining defects on the mask are left as they are and not repaired. The layer of resist is then exposed using the partially repaired mask. The remaining mask defects will cause unexposed latent images in the layer of resist. These unexposed regions of the resist are then exposed using supplemental radiation thereby correcting the exposure of the layer of resist. The layer of resist is then developed to form a defect free resist image.

BRIEF DESCRIPTION OF THE DRAWINGS

FIG. 1 shows a top view of a binary mask having defects.

FIG. 2 shows a cross section view of the binary mask of FIG. 1.

FIG. 3 shows a cross section view of the binary mask of FIG. 1 after the defects have been repaired.

DESCRIPTION OF THE PREFERRED EMBODIMENTS

Figure 4:
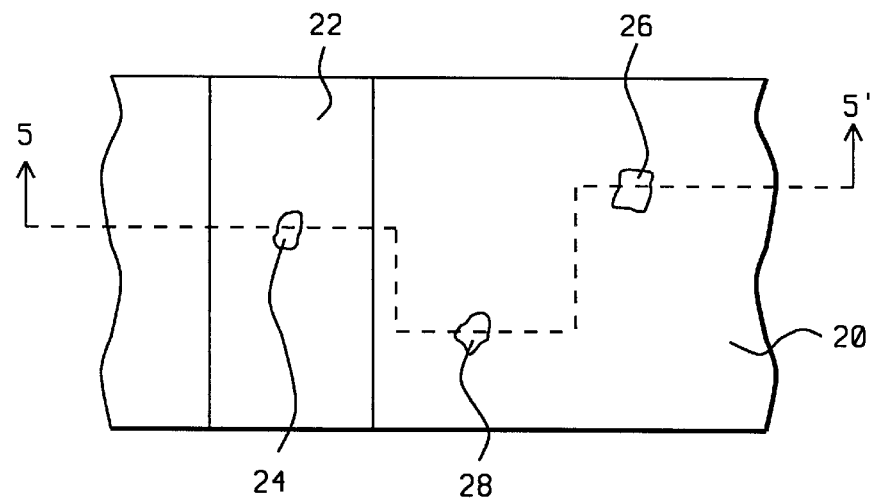
FIG. 4 shows a top view of a phase shifting mask having defects.
Figure 5:
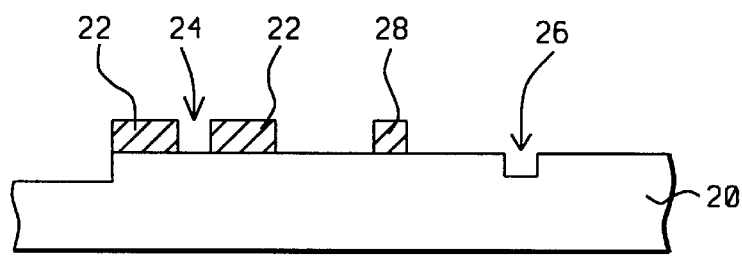
FIG. 5 shows a cross section view of the phase shifting mask of FIG. 4.
Figure 6:
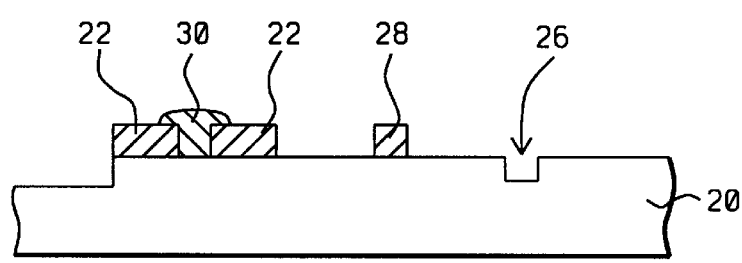
FIG. 6 shows a cross section view of the phase shifting mask of FIG. 4 after the defects in the opaque pattern elements of the mask have been repaired.

Refer now to FIGS. 4–15 for a detailed description of the method of this invention. FIG. 4 shows a top view and FIG. 5 a cross section view, taken along line 5–5' of FIG. 4, of a phase shifting mask. The mask has an opaque pattern element 22 and a number of defects. The first type of defect 24 is a pinhole within the opaque pattern element 22. The second type of defect 28 comprises opaque material remaining on the transparent mask substrate 20. The third type of defect 26 is a phase shifting defect due to removal of part of the transparent mask substrate material 20. In the method of this invention the first type of defect 24, the pinhole within the opaque pattern element 22, is first repaired directly on the mask by depositing opaque material 30 at the site of the defect as shown in FIG. 6. This defect is repaired directly on the mask because this type of defect can readily be repaired on the mask and because this defect will cause overexposed resist which is more difficult to repair in the resist image.

Figure 7:
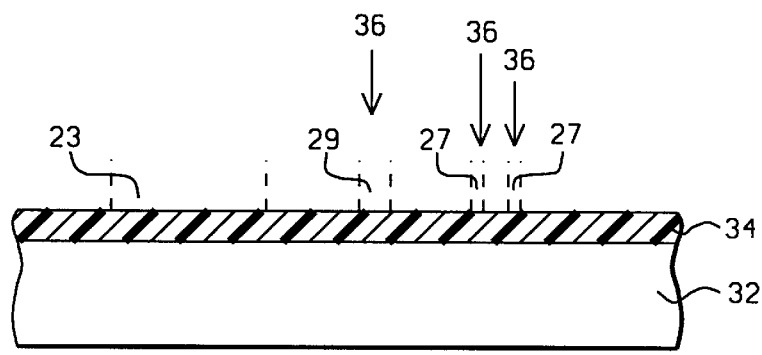
FIG. 7 shows a cross section view of a layer of resist which has been exposed using the partially repaired phase shifting mask of FIG. 6 and is being subjected to supplementary radiation.

The layer of resist is then exposed using a first radiation source, a first exposure dose, and the partially repaired mask. FIG. 7 shows the layer of resist 34, shown on a substrate 32, after exposure with the partially repaired mask. The region of the resist 23 corresponding to the repaired opaque pattern elements is not exposed. The region of the resist 29 corresponding to the second type of defect, stray opaque material on the mask, is not exposed. The regions of the resist 27 corresponding the phase transitions caused by the third type of defect, the phase defect, will either be unexposed or underexposed. The first radiation source can be a light source, an ion beam source, an electron beam source, an x-ray source, or the like. These unexposed or underexposed regions; 23, 27, and 29; of the layer of resist 34 will exhibit themselves as an underexposed latent image whereas the remaining regions; regions other than 23, 27, and 29; of the layer of resist 34 will have a properly exposed latent background. The parts of the underexposed latent image due to the mask defects, 27 and 29 in FIG. 7, are then given corrective supplemental exposure using a second radiation source 36 and a second exposure dose. The second radiation source can be the same as the first radiation source or can be different. The second radiation source 36 can be a light source, an ion beam source, an electron beam source, an x-ray source, or the like.

Figure 8:
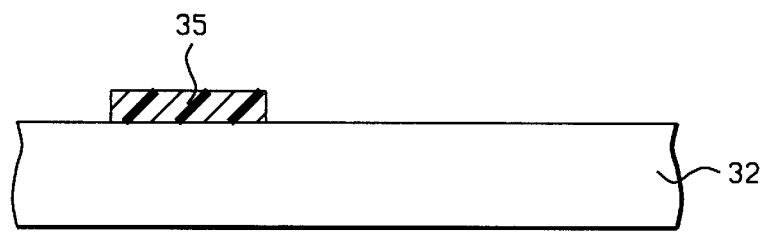
FIG. 8 shows a cross section view of a layer of developed positive resist after the positive resist has been exposed using supplementary radiation in addition to exposure using the partially repaired phase shifting mask of FIG. 6.
Figure 9:
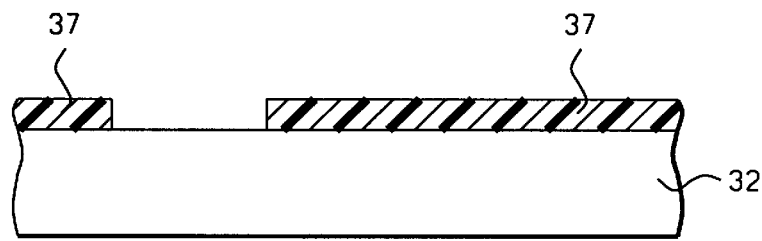
FIG. 9 shows a cross section view of a layer of developed negative resist after the negative resist has been exposed using supplementary radiation in addition to exposure using the partially repaired phase shifting mask of FIG. 6.

The layer of resist is then developed. The second exposure dose is sufficient to make the regions of the resist corresponding to the mask defects, 27 and 29, soluble in the developer and the developed resist image is free of the defects. The layer of resist 34 in FIG. 7 can either be positive or negative resist. FIG. 8 shows the developed resist image 35 for a layer of positive resist. FIG. 9 shows the developed resist image 37 for a layer of negative resist.

Figure 10:
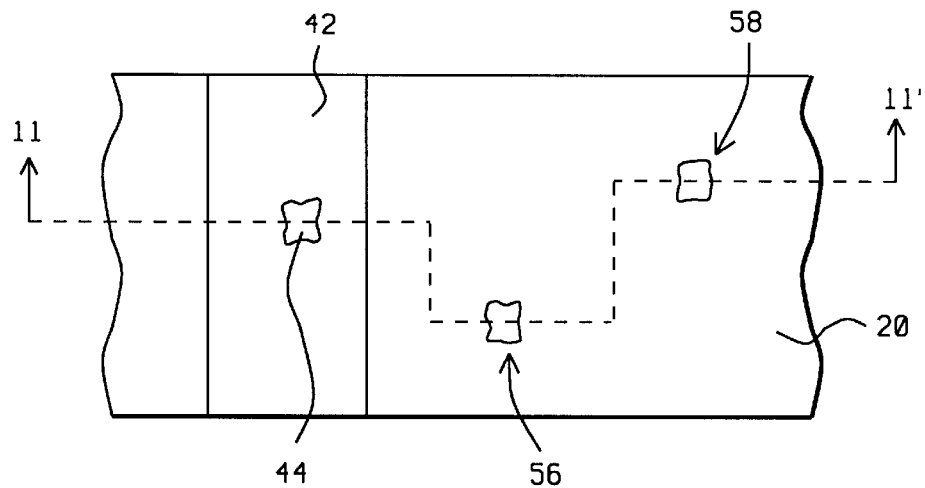
FIG. 10 shows a top view of an extreme ultraviolet mask having defects.
Figure 11:
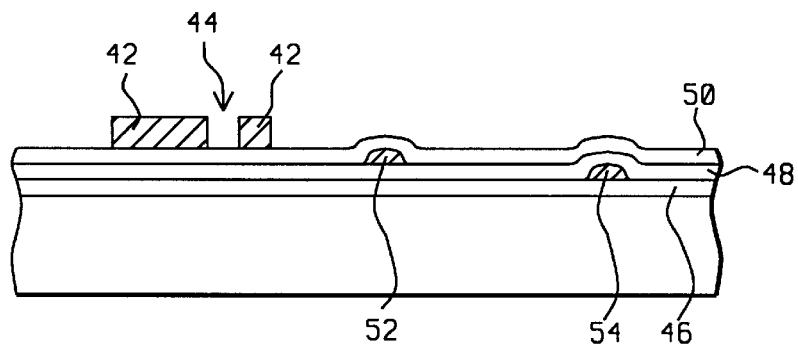
FIG. 11 shows a cross section view of the extreme ultraviolet mask of FIG. 10.
Figure 12:
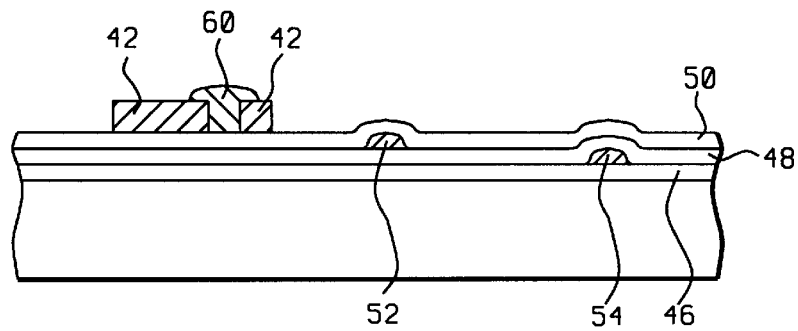
FIG. 12 shows a cross section view of the extreme ultraviolet mask of FIG. 10 after the defects in the opaque pattern elements of the mask have been repaired.
Figure 13:
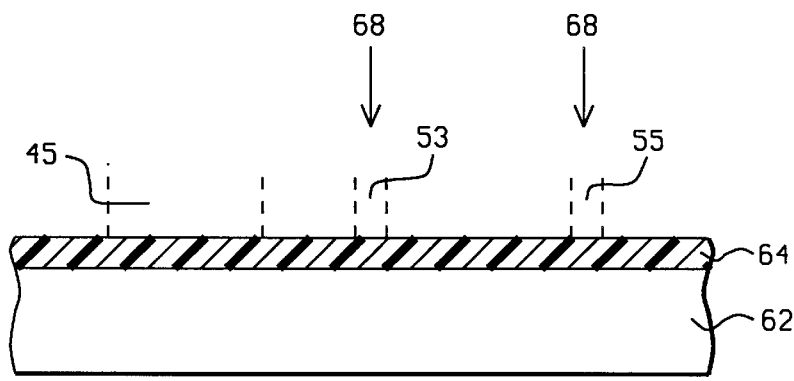
FIG. 13 shows a cross section view of a layer of resist which has been exposed using the partially repaired extreme ultraviolet mask of FIG. 12 and is being subjected to supplementary radiation.

FIG. 10 shows a top view and FIG. 11 a cross section view, taken along line 11–11' of FIG. 10, of an extreme ultraviolet mask. The mask has an opaque pattern element 42 and a number of defects. The first type of defect 44 is a pinhole within the opaque pattern element 42. The defects of a second type 56 and 56 are the result of foreign material 52 and 54 in between the layers of reflective material 46, 48, and 50 of the mask. In the method of this invention the first type of defect 44, the pinhole within the opaque pattern element 42, is first repaired directly on the mask by depositing opaque material 60 at the site of the defect as shown in FIG. 12. This defect is repaired directly on the mask because this type of defect can readily be repaired on the mask and because this defect will cause overexposed resist which is more difficult to repair in the resist image. The layer of resist is then exposed using a first radiation source, a first exposure dose, and the partially repaired mask. FIG. 13 shows the layer of resist 64, shown on a substrate 62, after exposure with the partially repaired mask. The region of the resist 45 corresponding to the repaired opaque pattern elements is not exposed. The regions of the resist 53 and 55 corresponding to the second type of defect, foreign material between the reflective layers of the mask, are not exposed or underexposed. The first radiation source can be a light source, an ion beam source, an electron beam source, an x-ray source, or the like. In this example the light source will be an ultraviolet light source. These unexposed or underexposed regions of the layer of resist 64 will exhibit themselves as an underexposed latent image. The parts of the underexposed latent image due to the mask defects, 53 and 55 in FIG. 13, are then given corrective supplemental exposure using a second radiation source 68 and a second exposure dose. The second radiation source can be the same as the first radiation source or can be different. The second radiation source 68 can be a light source, an ion beam source, an electron beam source, an x-ray source, or the like.

Figure 14:
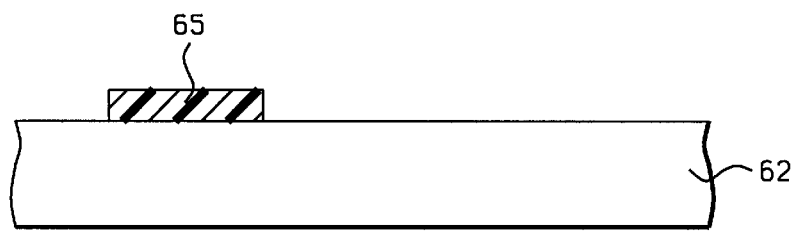
FIG. 14 shows a cross section view of a layer of developed positive resist after the positive resist has been exposed using supplementary radiation in addition to exposure using and the partially repaired extreme ultraviolet mask of FIG. 12.
Figure 15:
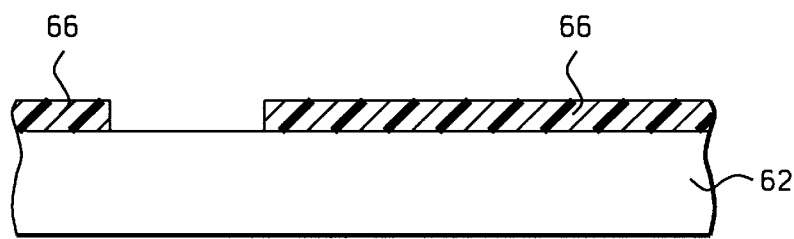
FIG. 15 shows a cross section view of a layer of developed negative resist after the negative resist has been exposed using supplementary radiation in addition to exposure using and the partially repaired extreme ultraviolet mask of FIG. 12.

The layer of resist is then developed. The second exposure dose is sufficient to make the regions of the resist corresponding to the mask defects, 53 and 55, soluble in the developer and the developed resist image is free of the defects. The layer of resist 64 in FIG. 13 can either be positive or negative resist. FIG. 14 shows the developed resist image 65 for a layer of positive resist. FIG. 15 shows the developed resist image 66 for a layer of negative resist.

While the invention has been particularly shown and described with reference to the preferred embodiments thereof, it will be understood by those skilled in the art that various changes in form and details may be made without departing from the spirit and scope of the invention.

What is claimed is:

1. A method of repairing lithographic images, comprising:
    providing a defective mask having opaque pattern elements, wherein said defective mask has defects external to said opaque pattern elements, wherein said defects are not repaired and will produce underexposed regions in a layer of resist exposed using said defective mask;

exposing a layer of resist using said defective mask, a first radiation source, and a first exposure dose, thereby forming a latent image in said layer of resist and whereby said defects in said defective mask produce underexposed regions in said latent image in said layer of resist;

exposing said underexposed regions in said latent image in said layer of resist using a second radiation source and a second exposure dose; and developing said layer of resist after exposing said underexposed regions in said latent image in said layer of resist.

2. The method of claim 1 wherein said second radiation source is the same as said first radiation source.

3. The method of claim 1 wherein said second exposure dose is the same as said first exposure dose.

4. The method of claim 1 wherein said second radiation source is different than said first radiation source.

5. The method of claim 1 wherein said second exposure dose is different from said first exposure dose.

6. The method of claim 1 wherein said mask is a phase shifting mask.

7. The method of claim 1 wherein said mask is an extreme ultraviolet mask.

8. The method of claim 1 wherein said first radiation source is an ultraviolet light source.

9. The method of claim 1 wherein said first radiation source is an electron beam source.

10. The method of claim 1 wherein said first radiation source is an x-ray source.

11. The method of claim 1 wherein said first radiation source is anion beam source.

12. The method of claim 1 wherein said second radiation source is an ultraviolet light source.

13. The method of claim 1 wherein said second radiation source is an electron beam source.

14. The method of claim 1 wherein said second radiation source is an x-ray source.

15. The method of claim 1 wherein said second radiation source is an ion beam source.

16. The method of claim 1 wherein said layer of resist is a layer of positive resist and said second exposure is sufficient to make said positive resist soluble in said developer.

17. The method of claim 1 wherein said layer of resist is a layer of negative resist and said second exposure is sufficient to make said negative resist insoluble in said developer.

18. A method of repairing lithographic images, comprising:

providing a defective mask having opaque pattern elements formed of a first opaque material, wherein said mask has first defects internal to said opaque pattern elements, second defects external to said opaque pattern elements, said first defects are regions having insufficient opaque material, said second defects are not repaired, and said second defects will produce underexposed regions in a layer of resist exposed using said defective mask;

repairing said first defects by adding a second opaque material to said defective mask;

exposing a layer of resist using said defective mask, a first radiation source, and a first exposure dose, thereby forming a latent image in said layer of resist and whereby said second defects in said mask produce underexposed regions in said latent image in said layer of resist;

exposing said underexposed regions in said latent image in said layer of resist using a second radiation source and a second exposure dose; and developing said layer of resist after exposing said underexposed regions in said layer of resist using said second radiation source.

19. The method of claim 18 wherein said second radiation source is the same as said first radiation source.

20. The method of claim 18 wherein said second exposure dose is the same as said first exposure dose.

21. The method of claim 18 wherein said second radiation source is different than said first radiation source.

22. The method of claim 18 wherein said second exposure dose is different from said first exposure dose.

23. The method of claim 18 wherein said mask is a phase shifting mask.

24. The method of claim 18 wherein said mask is an extreme ultraviolet mask.

25. The method of claim 18 wherein said first radiation source is an ultraviolet light source.

26. The method of claim 18 wherein said first radiation source is an electron beam source.

27. The method of claim 18 wherein said first radiation source is an x-ray source.

28. The method of claim 18 wherein said first radiation source is an ion beam source.

29. The method of claim 18 wherein said second radiation source is an ultraviolet light source.

30. The method of claim 18 wherein said second radiation source is an electron beam source.

31. The method of claim 18 wherein said second radiation source is an x-ray source.

32. The method of claim 18 wherein said second radiation source is an ion beam source.

33. The method of claim 18 wherein said layer of resist is a layer of positive resist and said second exposure is sufficient to make said positive resist soluble in said developer.

34. The method of claim 18 wherein said layer of resist is a layer of negative resist and said second exposure is sufficient to make said negative resist insoluble in said developer.

35. The method of claim 18 wherein said first opaque material is the same as said second opaque material.

* * * * *